_(12)_ United States Patent
Sasada

(10) Patent No.: US 9,285,436 B2
(45) Date of Patent: Mar. 15, 2016

(54) MAGNETIC FIELD SENSOR

(71) Applicant: Kyushu University, National University Corporation, Fukuoka (JP)

(72) Inventor: Ichiro Sasada, Fukuoka (JP)

(73) Assignee: Kyushu University (JP)

( * ) Notice: Subject to any disclaimer, the term of this patent is extended or adjusted under 35 U.S.C. 154(b) by 42 days.

(21) Appl. No.: 14/199,066

(22) Filed: Mar. 6, 2014

(65) Prior Publication Data

US 2014/0327434 A1 Nov. 6, 2014

Related U.S. Application Data

(63) Continuation of application No. PCT/JP2012/071681, filed on Aug. 28, 2012.

(30) Foreign Application Priority Data

Sep. 9, 2011 (JP) ................................. 2011-197605

(51) Int. Cl.
*G01R 33/04* (2006.01)
*G01R 33/02* (2006.01)
*G01R 33/028* (2006.01)

(52) U.S. Cl.
CPC ............ *G01R 33/04* (2013.01); *G01R 33/0206* (2013.01); *G01R 33/028* (2013.01)

(58) Field of Classification Search
CPC ... G01R 33/0206; G01R 33/028; G01R 33/04
USPC ............................................... 324/244–251
See application file for complete search history.

(56) References Cited

U.S. PATENT DOCUMENTS 5,560,115 A 10/1996 Fowler
2007/0257669 A1* 11/2007 Delevoye et al. ............. 324/253
(Continued)

FOREIGN PATENT DOCUMENTS

DE 10062292 A1 3/2002
EP 1746430 A1 * 1/2007 ............. G01R 33/04
(Continued)

OTHER PUBLICATIONS

International Search Report dated Oct. 2, 2012 for corresponding International Application No. PCT/JP2012/071681.
(Continued)

*Primary Examiner* — Jay Patidar
(74) *Attorney, Agent, or Firm* — Dingman, McInnes & McLane, LLP

(57) ABSTRACT

A magnetic sensor comprises an orthogonal flux-gate magnetometer having a first sensor head comprising a first magnetic core at least parallel portions of which are formed of magnetic material, and a first detection coil wound around said first magnetic core, said parallel portions of said first magnetic core being placed closely to each other. The magnetic sensor comprises a search-coil magnetometer having a second sensor head comprising a second magnetic core having a central axis placed coaxially with a central axis of the first magnetic core of said orthogonal flux-gate magnetometer, and a second detection coil wound around said second magnetic core. The first sensor head of said orthogonal flux-gate magnetometer is placed in a region in which magnetic flux density is increased through a magnet collection effect by the second magnetic core of said search-coil magnetometer.

10 Claims, 9 Drawing Sheets

(56) References Cited

U.S. PATENT DOCUMENTS

2010/0231222 A1* 9/2010 Bazinet .................. 324/345
2015/0048820 A1* 2/2015 Schaffer et al. ........... 324/253

FOREIGN PATENT DOCUMENTS

| | | |
|---|---|---|
| EP | 1852707 A1 | 11/2007 |
| EP | 1873543 A1 | 1/2008 |
| JP | 2005-69829 A | 3/2005 |
| JP | 2005069829 A | 3/2005 |
| JP | 2005-315812 A | 11/2005 |
| JP | 2008-014944 A | 1/2008 |

OTHER PUBLICATIONS

Seung-Hyun Hwang, Hyo-Min Kim, Jhoon Kim, Eun-Seok Lee, Dong-Hun Lee, Minwhan Jang, De-Rac Son, and Gwang-Rae Cho. "Overview of Scientific Payloads Onboard the KSR-III Rocket." Acta Astronautica 60 (2007) 880-888.

Extended European Search Report dated Dec. 21, 2015 from corresponding International Application No. PCT/JP2012/071681.

* cited by examiner

MAGNETIC FIELD SENSOR

CROSS-REFERENCE TO RELATED APPLICATIONS

This application is a continuation of International Application No. PCT/JP2012/071681, filed Aug. 28, 2012, now pending, which claims priority to Japanese Application No. 2011-197605, filed Sep. 9, 2011, the contents of which are incorporated herein by reference.

TECHNICAL FIELD

The present invention relates to a magnetic sensor that detects a magnetic field, and especially to a magnetic sensor that permits to detect a magnetic field from a direct-current magnetic field (a static magnetic field) to an alternate-current magnetic field of hundreds of kHz with high sensitivity.

BACKGROUND

A flux-gate magnetometer permits to detect a direct-current (dc) magnetic field with high sensitivity, however a carrier is about 100 kHz and a cutoff frequency thereof is no more than 1 kHz. A flux-gate magnetometer often uses a high-order low-pass filter, because of suppression of a switching surge included in an output waveform of a synchronous detector, thus increasing a phase lag in the vicinity of a cutoff frequency.

On the other hand, a search-coil magnetometer does not permit to detect a direct-current magnetic field, however it may be designed to have a relatively flat gain property relative to an alternate-current magnetic field from several Hz to tens of kHz. However, a signal-to-noise ratio (SN ratio) is inversely proportional to measurement frequency, and noise intensity is large on the side of low-frequency band and noise intensity is small on the side of high-frequency band.

Accordingly, the flux-gate magnetometer detects magnetic field of from the direct-current magnetic field to the alternate-current magnetic field of the low-frequency band, the search-coil magnetometer detects the alternate-current magnetic field of from a low-frequency band to a high-frequency band of about 20 kHz, and for the alternate-current magnetic field of an intermediate frequency band, an attribute fraction to an output may continuously be changed, together with the frequency, from the flux-gate magnetometer to the search-coil magnetometer. This makes it possible for the magnetic sensor provided with the flux-gate magnetometer and the search-coil magnetometer to detect the magnetic field of from the direct-current magnetic field to the alternate-current magnetic field of a high-frequency band of about 20 kHz with high sensitivity and at high resolution, without switching an operation mode from flux-gate magnetometer to the search-coil magnetometer When an active magnetic shield is made based on a negative feedback control, a large loop gain is required to enhance a shield effect. However, a large phase lag of a sensor by which a magnetic field is monitored would cause a system to be prone to oscillate, resulting in difficulty in making a stable control system with high gain.

One of keys to the solution of this problem is to how to manufacture a magnetic sensor with less phase lag at a band ranging to a high-frequency band.

A natural way of thinking is to synthesize seamlessly at least two magnetic sensors having different frequency band to be detected, in frequency response characteristic.

As a contracting sensor, there exists a sensor in which a core (a magnetic core) of a flux-gate magnetometer is used as a core (a magnetic core) of a search-coil magnetometer, a direct-current magnetic field and an alternate-current field of a low-frequency band are detected by the flux-gate magnetometer and an alternate-current magnetic field of a high-frequency band is detected by the search-coil magnetometer. However, such a magnetic field sensor does not always (simultaneously) operate both of two operational modes by the flux-gate magnetometer and the search-coil magnetometer, but performs a switching operation between the two modes in a time shared manner, thus being inapplicable to an active magnetic shield in which a continuous control is required.

An attempt to place a flux-gate magnetometer and a search-coil magnetometer closely to each other to operate simultaneously the flux-gate magnetometer and the search-coil magnetometer would cause a problem that an excitation magnetic field (a modulation magnetic field) applied to a core (a magnetic core) of the flux-gate magnetometer may become an unnecessary input (a magnetic field interference) to the search-coil magnetometer.

For example, a conventional magnetic field measurement apparatus for a railroad vehicle is provided with a combined magnetic field sensor, which is made by combining integrally a first three-axis magnetic sensor for measurement of a magnetic field of ultralow-frequency response characteristic of a leakage magnetic field, in which three magnetic sensing units are mutually orthogonal, and a second three-axis magnetic sensor for measurement of a magnetic field of high-frequency response characteristic of the leakage magnetic field, in which three magnetic sensing units are mutually orthogonal with each other (see for example Patent Document 1).

Concerning a conventional broadband magnetic field compensation system, a magnetic field measurement apparatus is provided with the first sensor and the second sensor. The first sensor is active to a magnetic field within the first frequency range, and this frequency range includes a lower frequency than the frequency range within which the second sensor is active to a magnetic field (see for example Patent Document 2).

Patent Document

[Patent Document 1] Japanese Patent Provisional Publication No. 2005-69829
[Patent Document 2] Japanese Patent Provisional Publication No. 2008-14944

DETAILED DESCRIPTION

Subject to be Solved

The conventional magnetic field measurement apparatus for a railroad vehicle is exemplified as forming the first three-axis magnetic sensor by a flux-gate type magnetic sensor, and forming the second three-axis magnetic sensor by a three-axis search-coil type magnetic sensor, and the first three-axis magnetic sensor and the second three-axis magnetic sensor are placed apart from each other. Because an attempt to place the flux-gate type magnetic sensor and the three-axis search-coil type magnetic sensor closely to each other to operate simultaneously the flux-gate type magnetic sensor and the three-axis search-coil type magnetic sensor would cause a magnetic field interference to the three-axis search-coil type magnetic sensor by a modulation magnetic field of the flux-gate type magnetic sensor, as described above.

However, placing the first three-axis magnetic sensor and the second three-axis magnetic sensor apart from each other would cause a problem that a size of the conventional magnetic field measurement apparatus for a railroad vehicle is increased and there is difficulty in measuring a magnetic field at the same or near point.

The conventional broadband magnetic field compensation system is exemplified as providing the first sensor in the form of a flux-gate sensor and providing the second sensor in the form of an induction coil. However, it is not clearly described as to whether the flux-gate sensor is an orthogonal flux-gate sensor, and there is neither disclosed nor suggested a positional relationship between the first sensor and the second sensor.

An object of the present invention, which was made to solve the above-described problems, is to provide a magnetic field sensor that permits to operate simultaneously a flux-gate magnetometer and a search-coil magnetometer, and place the flux-gate magnetometer and the search-coil magnetometer closely to each other so as to decrease a size of the sensor, as well as permits to measure a magnetic field from a direct-current magnetic field to an alternate-current magnetic field of a high-frequency band at the same or near point.

The magnetic sensor of the present invention comprises: an orthogonal flux-gate magnetometer having a first sensor head comprising a first magnetic core at least parallel portions of which are formed of magnetic material, and a first detection coil wound around the first magnetic core, the parallel portions of the first magnetic core being placed closely to each other; and a search-coil magnetometer having a second sensor head comprising a second magnetic core having a central axis placed coaxially with a central axis of the first magnetic core of the orthogonal flux-gate magnetometer, and a second detection coil wound around the second magnetic core, wherein: the first sensor head of the orthogonal flux-gate magnetometer is placed in a region in which magnetic flux density is increased through a magnet collection effect by the second magnetic core of the search-coil magnetometer.

According to the magnetic sensor of the present invention, it is possible to operate simultaneously the orthogonal flux-gate magnetometer and the search-coil magnetometer, and place the orthogonal flux-gate magnetometer and the search-coil magnetometer closely to each other so as to decrease a size of the sensor, as well as to measure the magnetic field from a direct-current magnetic field to an alternate-current magnetic field of a high-frequency band at the same or near point.

FIRST EMBODIMENT

Figure 1A:
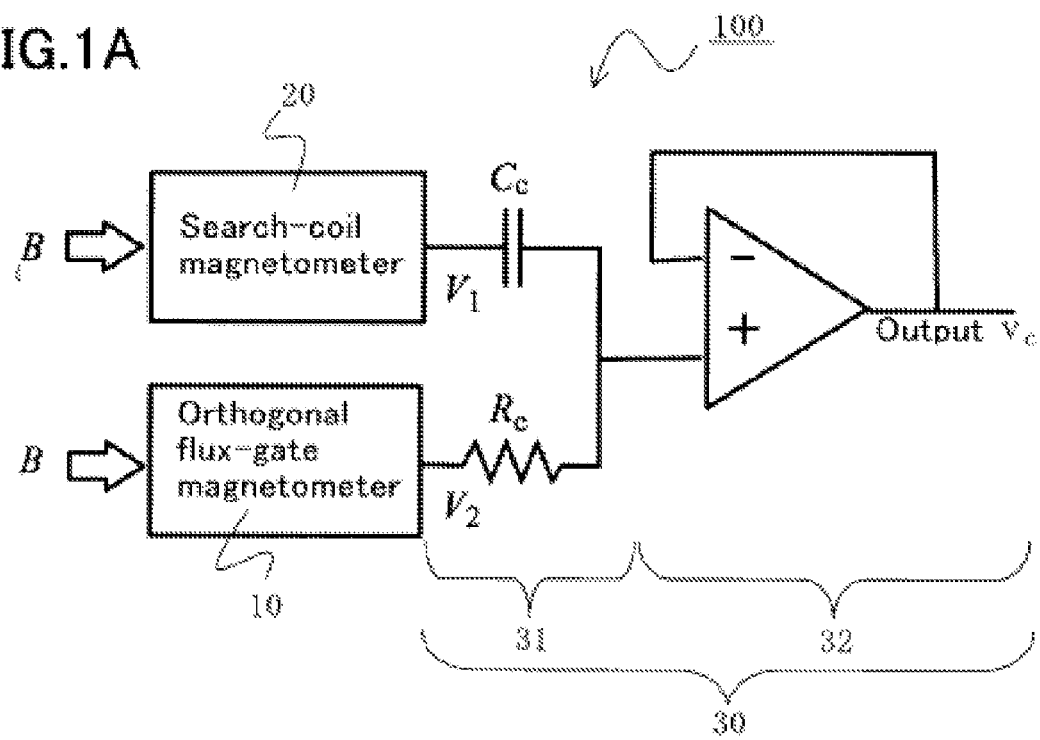
FIG. 1(a) is a schematic structural view illustrating an example of a magnetic sensor according to the first embodiment of the present invention.

A magnetic sensor 100 is composed of, as classified components, an orthogonal flux-gate magnetometer 10, a search-coil magnetometer 20 and a synthesis unit 30, as shown in FIG. 1(a).

First, the orthogonal flux-gate magnetometer 10 will be described below.

Figure 2A:
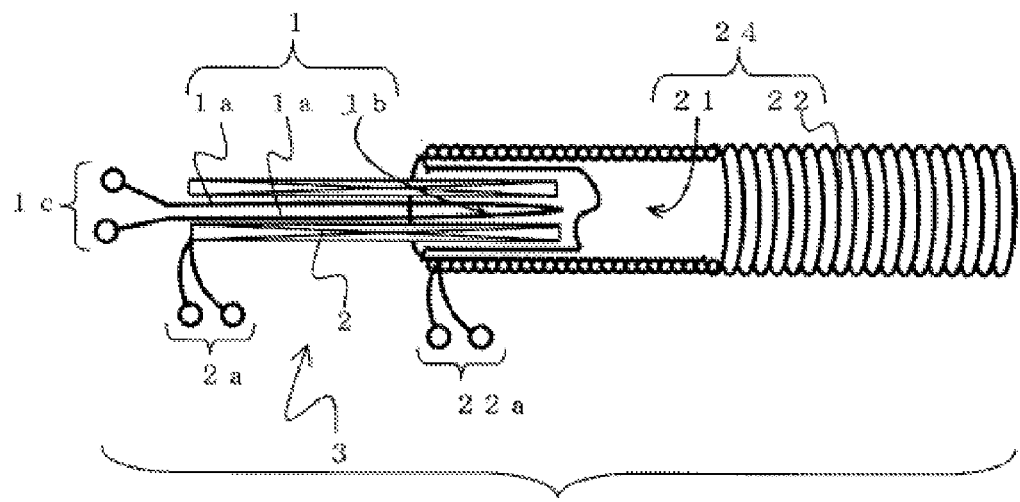
FIG. 2(a) is a schematic structural view illustrating an example of a combined sensor head of the magnetic sensor according to the first embodiment of the present invention.

The orthogonal flux-gate magnetometer 10 is provided with a sensor head (hereinafter referred to as the "first sensor head 3"), which is composed of a core (hereinafter referred to as the "first magnetic core 1") at least parallel portions 1a of which are formed of magnetic material, and a detection coil (hereinafter referred to as the "first detection coil 2") wound around the first magnetic core 1, and the parallel portions 1a of the first magnetic core 1 are placed closely to each other, as shown in FIG. 2(a).

The first magnetic core 1 according to the embodiment of the present invention is a U-shaped core, and the parallel portions 1a and a curved portion 1b extending to the parallel portions 1a are formed of magnetic material, with the result that a distance between the adjacent parallel portions 1a can be decreased in comparison with a case where parallel portions 1a are formed of magnetic material and a curved portion 1b is formed of an electric wire. However, it may be applied a structure in which the parallel portions 1a are formed of magnetic material and the curved portion 1b is formed of an electric wire. The first magnetic core 1 is provided so that the adjacent parallel portions 1a face directly each other without placing a wound wire of the first detection coil 2 between them, and are inserted into a center of the first detection coil 2. This makes it possible to place the adjacent parallel portions 1a closely to each other by a distance of a diameter of the would wire of the first detection coil 2, in comparison with a case where the first detection coil 2 is wound around the respective parallel portions 1a of the first magnetic core 1, thus being preferable.

Figure 1B:
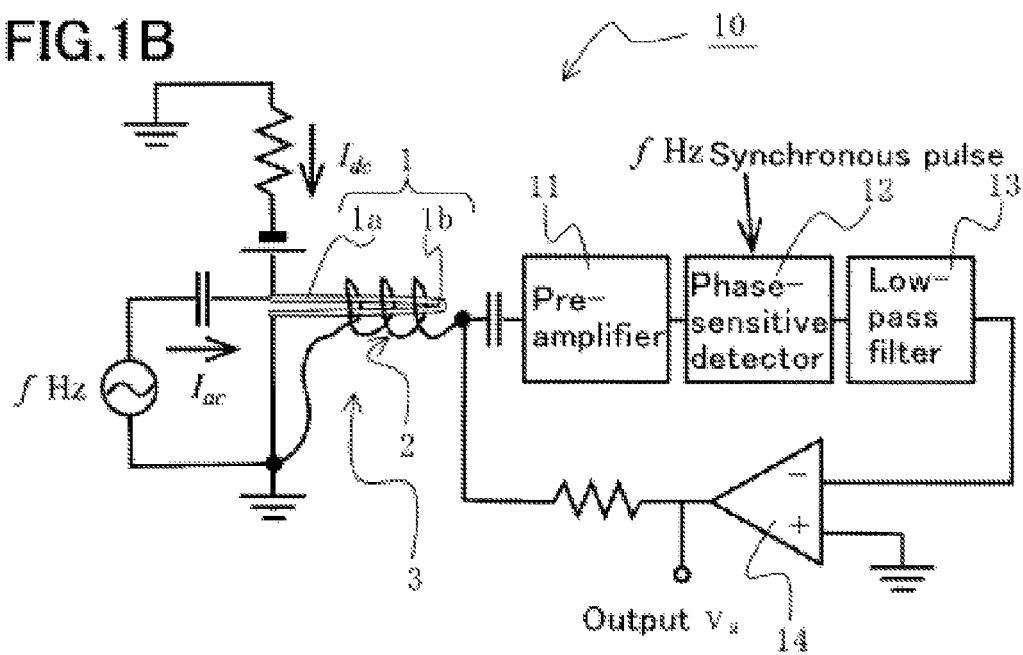
FIG. 1(b) is a circuit diagram illustrating an example of an orthogonal flux-gate magnetometer as shown in FIG. 1(a)

As the orthogonal flux-gate magnetometer 10 according to the embodiment of the present invention, there is used a fundamental wave type orthogonal flux-gate magnetometer 10 which permits to obtain an output of the first detection coil 2, which is the same output of the fundamental wave as an alternate-current excitation frequency f [Hz], by superimposing the alternate-current excitation frequency $I_{ac}$ applied to the first magnetic core 1 with a larger direct current $I_{dc}$ than an amplitude of the alternate-current excitation frequency $I_{ac}$, as shown in FIG. 1(*b*).

This fundamental wave type orthogonal flux-gate magnetometer 10 is composed, as the first sensor head 3, of the first U-shaped magnetic core 1 obtained by bending an amorphous magnetic wire into a hairpin shape, and the first detection coil 2, which is hollow and has a small diameter, and is placed so as to surround the first magnetic core 1. Concerning the fundamental wave type orthogonal flux-gate magnetometer 10 according to the embodiment of the present invention, a length of the first sensor head 3 is 25 mm, a diameter of the first sensor head is 10 mm, an outer diameter of the first detection coil 2 is 3 mm, and a number of turns of the first detection coil 2 is about 800 turn. However, these sizes and the number of turns are not limited only to these values as indicated above.

The fundamental wave type orthogonal flux-gate magnetometer 10 is provided with, as basic structural components performing a negative feedback type, a pre-amplifier 11 that is connected through a condenser to a downstream side of a terminal 2a of the first detection coil 2 to amplify an input signal, a phase-sensitive detector (PSD) 12 that is connected to a downstream side of the pre-amplifier 11 to conduct a synchronous rectification against an input signal with a synchronization pulse of the alternate-current excitation frequency f [Hz], a low-pass filter 13 that is connected to a downstream side of the phase-sensitive detector 12 to remove a high frequency component, and an operational amplifier 14 that has an inverting input terminal (− input terminal, minus terminal) connected to a downstream side of the low-pass filter 13 and an output terminal connected through a resistance to a terminal 2a of the first detection coil 2.

Now, the search-coil magnetometer 20 will be described below.

The search-coil magnetometer 20 is provided with a sensor head (hereinafter referred to as the "second second sensor head 24"), which is composed of a core (hereinafter referred to as the "second magnetic core 21") having a central axis placed coaxially with a central axis of the first magnetic core 1 of the orthogonal flux-gate magnetometer 10, and a detection coil (hereinafter referred to as the "second detection coil 22") wound around the second magnetic core 21, as shown in FIG. 2(*a*).

The second sensor head 24 of the search-coil magnetometer 20 according to the embodiment of the present invention has been prepared by winding a magnetic tape having a width of 50 mm around a pipe formed of plastic material having an outer diameter of 10 mm by several turns into a cylindrical shape (the second magnetic core 21) to obtain a core as the second magnetic core 21, winding a wire around this core (the second magnetic core 21) to provide the second detection coil 22 with the number of turns $n_1$ of 300 turn, and then winding a wire around it to provide the feedback coil 23 with the number of turns $n_2$ of 14 turn.

A Co (cobalt) based amorphous tape (for example, a product name of "Metglas2714A", or a product name of "VITROVAC 6025 150") may be used as the magnetic tape, and it is possible to control occurrence of an eddy current by placing an insulating film between the magnetic tapes to be overlapped to each other.

Concerning the search-coil magnetometer 20 according to the embodiment of the present invention, the number of turns of the second detection coil 22 is 300 turn and small as the search coil, placing an importance on verification of a principle in an experiment. However, the number of turns is not limited onto to this value as indicated above.

The search-coil magnetometer 20 is provided with a non-inverting amplifier circuit 25 that has a non-inverting input terminal (+ input terminal, plus terminal) connected to a terminal 22a of the second detection coil 22 and obtains a voltage, which is proportional to an input voltage jwΦ, and an integration circuit 26 that is connected to a downstream side of the non-inverting amplifier circuit 25 to obtain a flat gain property, as shown in FIG. 3(*a*). This integration circuit 26 permits to take partially an integral action at a frequency of several Hz or more to achieve a constant gain within a wide frequency range, thus imparting a gain property smoothly continuing to the gain property of the orthogonal flux-gate magnetometer 10.

Concerning the search-coil magnetometer 20, the output terminal of the non-inverting amplifier circuit 25 is connected to the feedback coil 23 through a feedback resistance $R_f$, so as to restrain variation of magnetic flux interlinking the second detection coil 22, thus controlling an influence of a self-resonance of the second detection coil 22. Concerning the search-coil magnetometer 20, the output voltage from the non-inverting amplifier circuit 25 has a linear relationship to ωΦ in a low-frequency band, so that $f=1/(2\pi C_T R_T)$ provides a low cutoff frequency.

Figure 3A:
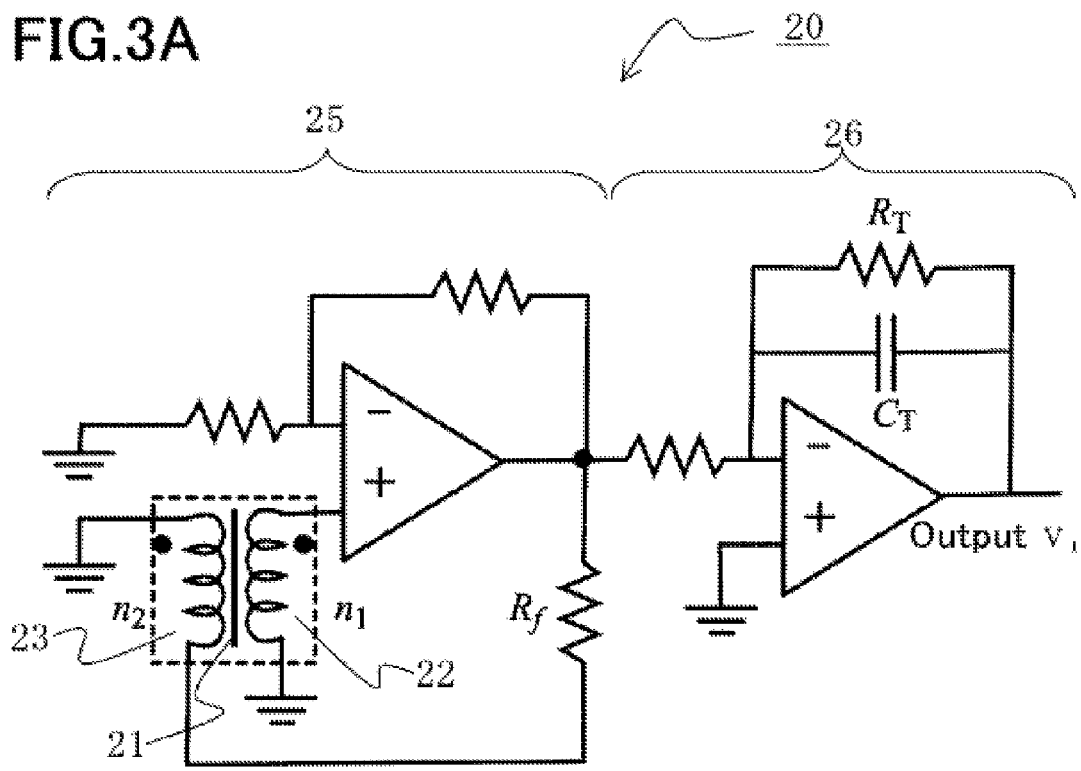
FIG. 3(a) is a circuit diagram illustrating an example of a search-coil magnetometer as shown in FIG. 1(a)
Figure 3B:
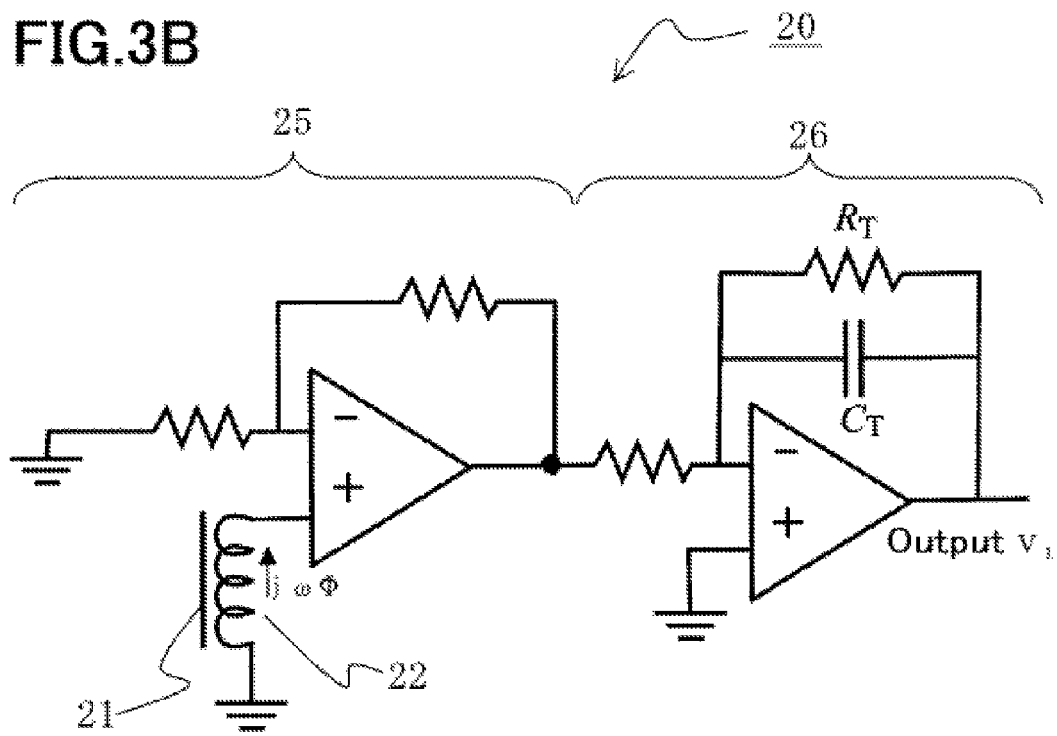
FIG. 3(b) is a circuit diagram illustrating another example of the search-coil magnetometer as shown in FIG. 1(a)

The search-coil magnetometer 20 may not be provided with the feedback coil 23 and the feedback resistance $R_f$, as shown in FIG. 3(B), unless an influence of a self-resonance of the second detection coil 22 is controlled.

Now, description will be given below of the combined sensor head 103 in combination of the first sensor head 3 of the orthogonal flux-gate magnetometer 10 and the second sensor head 24 of the search-coil magnetometer 20.

Figure 4:
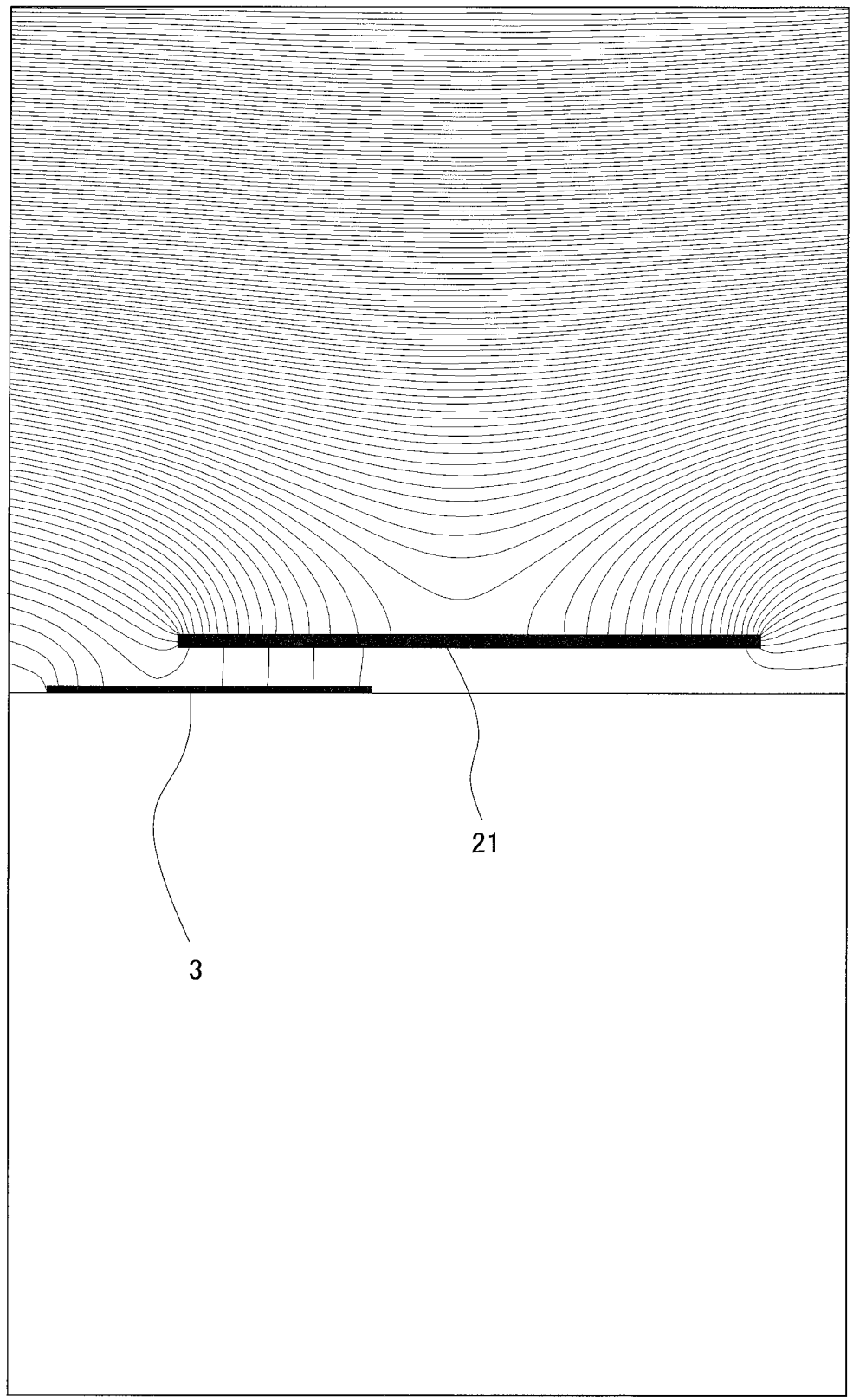
FIG. 4 is a descriptive view showing a magnet collection effect by the second magnetic core of the search-coil magnetometer.

The first sensor head 3 of the orthogonal flux-gate magnetometer 10 is placed so that the central axis of the first magnetic core 1 is coaxial with the central axis of the second magnetic core 21 of the search-coil magnetometer 20, for example in an region in which the magnetic flux density is increased through a magnet collection effect (a magnetic flux concentration) by the second magnetic core 21 of the search-coil magnetometer 20, as shown in FIG. 4.

Description will be given below, using calculation results of values, of a favorable position, upon placing the first sensor head 3 (the first magnetic core 1) of the orthogonal flux-gate magnetometer 10, in a region in which the magnetic flux density is increased through a magnet collection effect by the second magnetic core 21 of the search-coil magnetometer 20.

In calculation of values, there is an assumption that a cylinder hollow (which is simulated as the second magnetic core 21 of the search-coil magnetometer 20) of a magnetic material (having an assumed magnetic permeability $\mu_r$ of 10,000) having substantially the same size as the second magnetic core 21 of the search-coil magnetometer 20, and a cylinder solid (which is simulated as the first sensor head 3 (the first magnetic core 1) of the orthogonal flux-gate magnetometer 10) of a magnetic material (having an assumed magnetic permeability $\mu_r$ of 10,000) having the length of 25 mm and a small diameter are placed so that their central axes are coaxial with each other, and a constant magnetic field (1G=100 μT) is applied parallelly to the central axes of both cylinders. It is understandable from FIG. 4 and FIG. 5 that the magnetic flux passing through the central solid simulated as the first sensor head 3 of the flux-gate magnetometer 10 passes through also the cylinder hollow, thus providing a magnet collection effect on the cylinder hollow, and the magnetic flux as measured by the search-coil magnetometer 20 is also measured by the flux-gate magnetometer 10 (This proves that the measurement can be conducted at the same or near point). When lines of magnetic flux passing through the first sensor head 3 of the flux-gate magnetometer 10 and the second sensor head 24 of the search-coil magnetometer 20 are low-frequency, they are detected by the flux-gate magnetometer 10 and when they are high-frequency, they are detected by the search-coil magnetometer 20.

Figure 5:
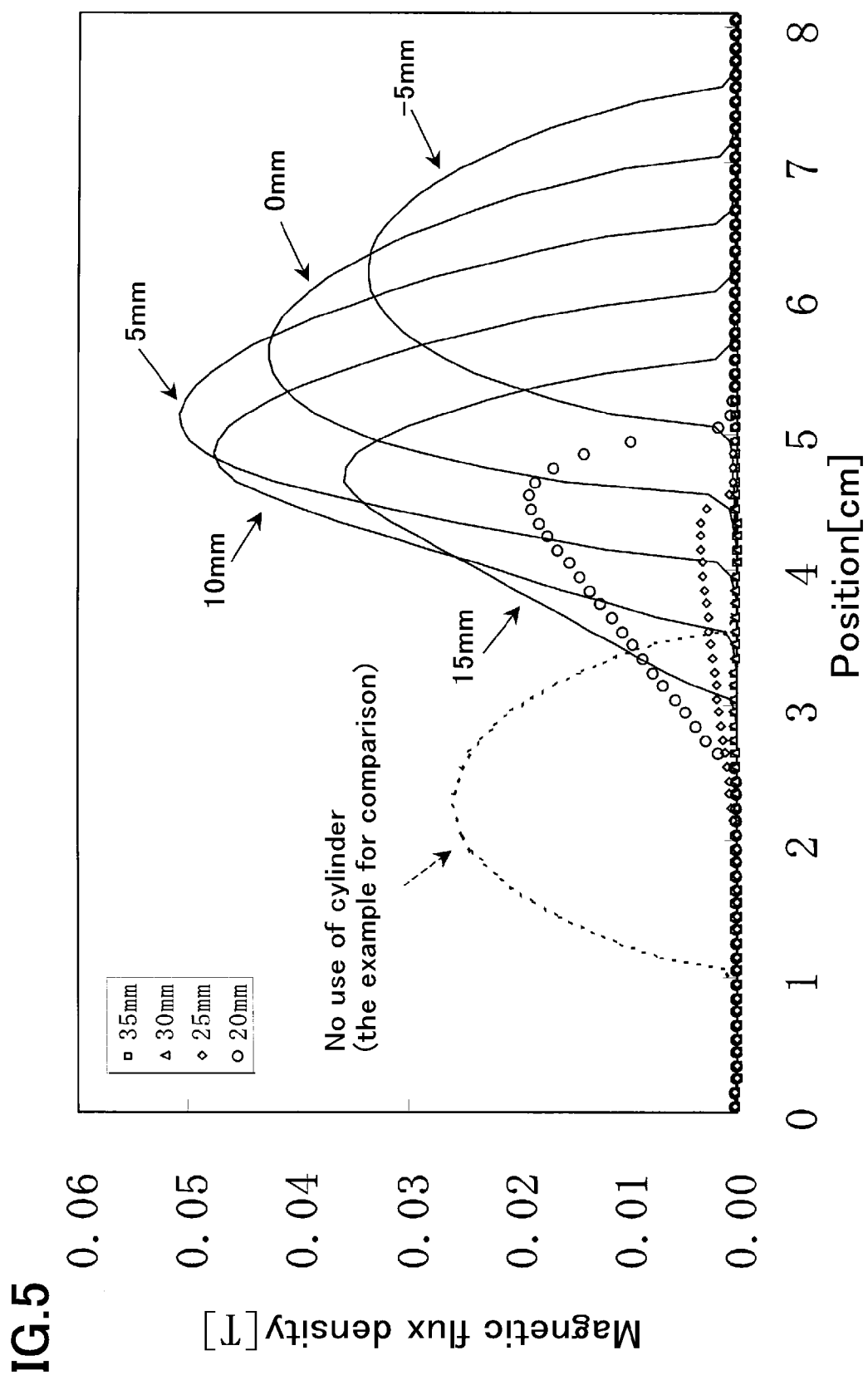
FIG. 5 is a graph showing the magnet collection effect with calculated values.

FIG. 5 shows that a distribution of the magnetic flux density on the central axis of the cylinder solid varies depending on a distance between the end (the bottom surface) of the cylinder solid and the end (the opening) of the cylinder hollow, and a graph in a broken line shows, as the example for comparison, a distribution of the magnetic flux density on the central axis of the cylinder solid in the absence of a cylinder hollow.

It is understood as shown in FIG. 5 that the peak of the magnetic flux density becomes the highest in case where the end of the cylinder solid is inserted into the end of the cylinder hollow by a distance of 5 mm, and the peak of the magnetic flux density decreases with increasing or decreasing distance between the end of the cylinder solid and the end of the cylinder hollow from a critical point of an amount of insertion of 5 mm, in case where a part or the whole of the cylinder solid is placed in the inside of the cylinder hollow. In addition, it is understood that, in case where the cylinder solid having the length of 25 mm is completely inserted into the cylinder hollow (with an amount of insertion of 30 mm, 35 mm), the magnetic flux density on the central axis of the cylinder solid is almost null because of a shield effect by the cylinder hollow, and the sensitivity of the orthogonal flux-gate magnetometer 10 is also almost null.

It is understood that, especially, in case where the cylinder solid is inserted into the cylinder hollow so that the distance between the end of the former and the end of the latter is 5 mm, the magnetic flux density increases about twice in comparison with a case of using no cylinder hollow (the example for comparison), due to the magnet collection effect by the cylinder solid made of the magnetic material, the sensitivity of the orthogonal flux-gate magnetometer 10 becomes higher in proportion to it.

In case where the cylinder solid is placed outside the cylinder hollow, an influence of the magnet collection effect by the cylinder hollow on the cylinder solid becomes smaller, and the peak of the magnetic flux density becomes lower with increasing distance between the end of the cylinder solid and the end of the cylinder hollow.

Therefore, a preferable position at which the first sensor head 3 (the first magnetic core 1) of the orthogonal flux-gate magnetometer 10 is based on the distance between the end of the cylinder solid and the end of the cylinder hollow, in which the peak of the magnetic flux density is higher than the peak of the magnetic flux density of the example for comparison (in case where there is no magnetic collection effect by the cylinder hollow), and it is preferable to place the end of the cylinder solid between −5 mm (distance apart of 5 mm) and +15 mm (an amount of insertion of 15 mm).

The magnetic collection effect by the cylinder hollow (the second magnetic core 21) depends on the length of the cylinder solid (the first sensor head 3 (the first magnetic core)), and in other words, a preferable position at which the first sensor head 3 (the first magnetic core 1) of the orthogonal flux-gate magnetometer 10 is to be placed, is based on a requirement that a ratio of a part of the first sensor head (the first magnetic core 1) of the orthogonal flux-gate magnetometer 10, which is placed in the inside of the second magnetic core 21 of the search-coil magnetometer 20, relative to the whole length of the first sensor head 3 (the first magnetic core 1) of the orthogonal flux-gate magnetometer 10 is from 0% (=100%×0 mm/25 mm) or more to 60% (=100%×15 mm/25 mm) or less.

Alternatively, a preferable position at which the first sensor head 3 (the first magnetic core 1) of the orthogonal flux-gate magnetometer 10 is to be placed, is based on a requirement that a ratio of a distance (distance apart) between the end of the first sensor head 3 (the first magnetic core 1) of the orthogonal flux-gate magnetometer 10 and the end of the second magnetic core 21 of the search-coil magnetometer 20, relative to the whole length of the first sensor head 3 (the first magnetic core 1) of the orthogonal flux-gate magnetometer 10 is from 0% (=100%×0 mm/25 mm) or more to 20% (=100%×|−5 mm|/25 mm) or less. When the position at which the first sensor head 3 (the first magnetic core 1) of the orthogonal flux-gate magnetometer 10 is to be placed, is set as being outside of the second magnetic core 21 of the search-coil magnetometer 20 in this manner, the second magnetic core 21 is not limited only to the cylinder hollow, and may be for example a cylinder solid.

A preferable position at which the first sensor head 3 (the first magnetic core 1) of the orthogonal flux-gate magnetometer 10 is to be placed, in other words, a distance between the end of the first sensor head 3 of the orthogonal flux-gate magnetometer 10 and the end of the second magnetic core 21 of the search-coil magnetometer 20 is smaller than a diameter of the first sensor head of the orthogonal flux-gate magnetometer 10 (the second sensor head of the search-coil magnetometer 20).

Especially, it is preferable to place spatially the central point of sensitivity of the first sensor head 3 (the first detection coil 2) of the orthogonal flux-gate magnetometer 10 and the central point of sensitivity of the second sensor head 24 (the second detection coil 22) of the search-coil magnetometer 20 closely to each other, for the detection of the magnetic field at the same or near point.

When the sensor head of the conventional orthogonal flux-gate magnetometer is placed closely to the sensor head of the search-coil magnetometer, an excitation magnetic field (a modulation magnetic field) applied to the magnetic core of the orthogonal flux-gate magnetometer may however become magnetic field interference to the search-coil magnetometer. It is recognized that a large excitation magnetic field may occur especially in a parallel flux-gate magnetometer, and there may be severe magnetic field interference to the search-coil magnetometer.

To the contrary, the excitation magnetic field generated from the orthogonal flux-gate magnetometer is proportional to an area surrounded by a current path (a magnetic core). In the orthogonal flux-gate magnetometer 10 according to the present invention, it is therefore possible to reduce the excitation magnetic field by forming the shape of the first magnetic core 1 into a hairpin shape. More specifically, in the combined sensor head 103 according to the embodiment of the present invention, no problem of magnetic field interference occurs even when the first sensor head 3 of the orthogonal flux-gate magnetometer 10 is placed closely to the second sensor head 24 (the second detection coil 22) of the search-coil magnetometer 20

Figure 2B:
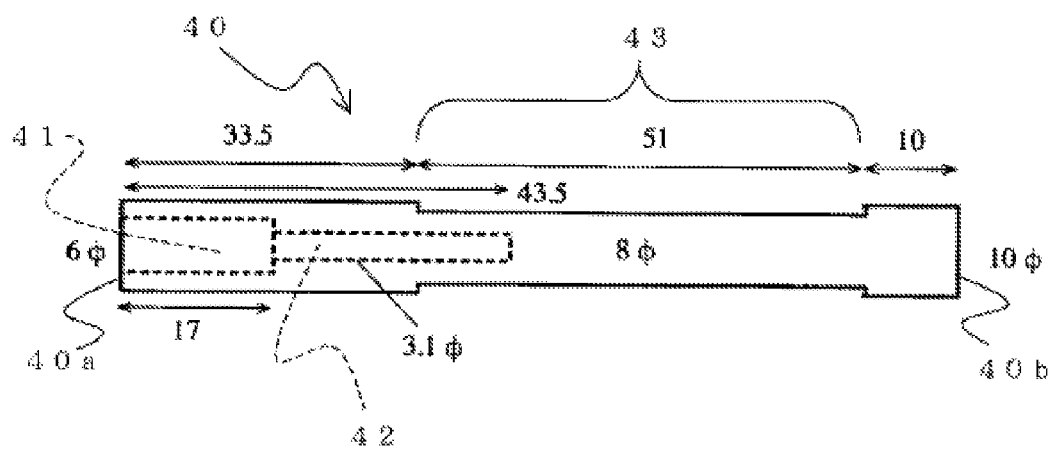
FIG. 2(b) is a plan view illustrating an example of a supporting member of the combined sensor head according to the first embodiment of the present invention.
Figure 2C:
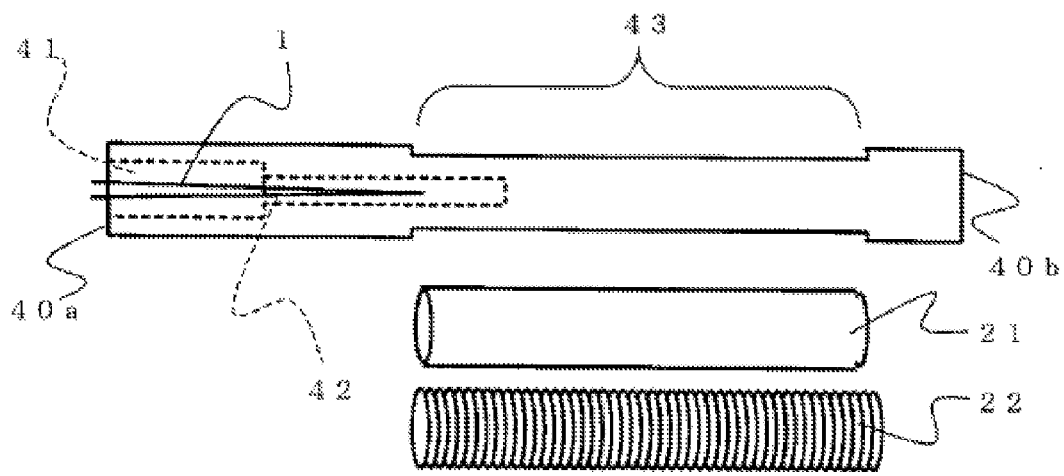
FIG. 2(c) is a plan view illustrating examples of the supporting member, the second magnetic core and the second detection coil of the combined sensor head according to the first embodiment of the present invention.

So, the combined sensor head 103 according to the embodiment of the present invention is provided with a supporting member 40 that supports the first sensor head 3 of the orthogonal flux-gate magnetometer 10 and the second sensor head 24 of the search-coil magnetometer 20 in a predetermined place, and the front end portion of the first sensor head 3 of the orthogonal flux-gate magnetometer 10 is inserted, by a small distance (about 1 cm), into the inside of the second magnetic core 21 of the search-coil magnetometer 20, as shown for example in FIG. 2(b) and FIG. 2(c).

The supporting member 40 is prepared by forming a large-diameter bore 41 (having a depth of 17 mm and an inside diameter of 6 mm) and a small-diameter bore 42 (having a depth of 26.5 mm and an inside diameter of 3.1 mm), into which the first sensor head 3 is to be inserted, in a cylinder solid formed of plastic material (having the entire length of 94.5 mm and an outside diameter of 10 mm), and forming a small diameter portion 43 having a diameter of 8 mm in which the second magnetic core 21 and the second detection coil 22 of the search-coil magnetometer 20 are to be placed, at a region (having the length of 51 mm) between a position placed away from the one end 40a of the cylinder solid (on the side from which the first sensor head 3 is to be inserted) by a distance of 33.5 mm and another position placed away from the other end 40b of the cylinder solid (the opposite side to the side from which the first sensor head 3 is to be inserted) by a distance of 10 mm.

Such a structure of this combined sensor head 103 has not only an advantage that it can provide a compact united body, as well as the central axis of the first sensor head 3 (the first magnetic core 1, the first detection coil 2) of the orthogonal flux-gate magnetometer 10 and the central axis of the second sensor head 24 (the second magnetic core 21, the second detection coil 22) of the search-coil magnetometer 20 are commonly coincide with each other, thus permitting to measure the magnetic field in the same direction, but also an advantage that the second magnetic core 21 of the search-coil magnetometer 20 has a magnet collection effect relative to the first sensor head 3 of the orthogonal flux-gate magnetometer 10.

Such an advantage of the structure of the combined sensor head 103 permits to reduce remarkably an area surrounded by the first magnetic core 1 (a current path) to which an electric current is applied (a direct current $I_{dc}$, an electric current ($I_{dc}+I_{ac}$) of the direct current $I_{dc}$ and an alternate current ($I_{ac}$) as superimposed, and the alternate current ($I_{ac}$)). Accordingly, an intensity of the excitation magnetic field generated by the first magnetic core 1 serving as a dipole magnetic field source with temporarily varying magnetic intensity is small, with the result that a magnetic field interference of the orthogonal flux-gate magnetometer 10 to the search-coil magnetometer 20 is almost negligible.

In the combined sensor head 103 according to the embodiment of the present invention, a curved portion 1b of the first magnetic core 1 is determined as serving the front end portion of the first sensor head 3, which is inserted in the inside of the second magnetic core 21 of the search-coil magnetometer 20 or placed most closely to the magnetic core 21. However, in the combined sensor head 103, an input terminal 1c side of the first magnetic core 1 may be inserted as the front end portion of the first sensor head 3, in the inside of the second magnetic core 21 of the search-coil magnetometer 20 or placed, as such a front end portion, most closely to the magnetic core 21. It is preferable to determine the curved portion 1b side of the first magnetic core 1 as the front end portion of the first sensor head 3, since using the input terminal 1c side of the first magnetic core 1 as the front end portion of the first sensor head 3 would require a dead space for a solder connection between the input terminal 1c of the first magnetic core 1 and a connection terminal of an alternate current source and/or a direct current source.

Now, description will be given below of a synthesizing process of an output from the orthogonal flux-gate magnetometer 10 and an output from the search-coil magnetometer 20, with reference to FIG. 1(a) and FIG. 6.

A synthesizing unit 30 of the magnetic sensor 100 is provided with a condenser $C_c$ connected to the output terminal of the search-coil magnetometer 20, a resistance $R_c$ connected to the output terminal of the orthogonal flux-gate magnetometer 10, and a buffer circuit (a voltage follower circuit) 32 that has a non-inverting input terminal connected to an output terminal of a C-R voltage dividing circuit 31 for the resistance $R_c$ and the condenser $C_c$, so as to convert a high-impedance input into a low-impedance output, as shown in FIG. 1(a).

Figure 6A:
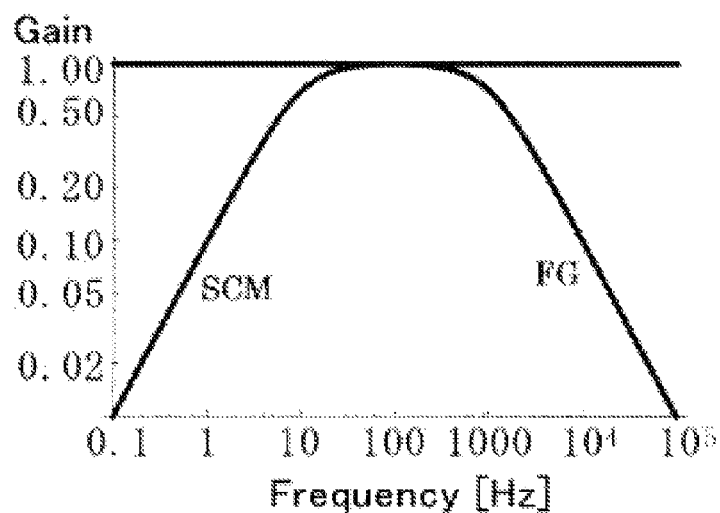
FIG. 6(a) is a frequency response characteristic diagram showing a superimposed gain curve in a synthesized output from a C-R voltage-dividing circuit.

Here, there is an assumption that the output $V_2$ of the orthogonal flux-gate magnetometer 10 ("FG" in FIG. 6(a)) for detecting the magnetic field from the direct current (dc) magnetic field to the alternate current magnetic field of a low-frequency band and the output $V_1$ of the search-coil magnetometer 20 ("SCM" in FIG. 6(a)) for detecting the alternate current magnetic field of a high-frequency band are the same in sensitivity at a flat portion of a property curve relative to an input magnetic field B, as shown in FIG. 6(a).

When the output $V_2$ of the orthogonal flux-gate magnetometer 10 and the output $V_1$ of the search-coil magnetometer 20 are synthesized by the C-R voltage dividing circuit 31, the synthesized output $V_c$ may be presented by the following equation:

$$V_c = (V_1 R_c + V_2/(j\omega C_c))/(R_c + 1/(j\omega C_c)) \qquad \text{Equation (1)}$$

Property curves of both of frequency bands as detected by the orthogonal flux-gate magnetometer 10 and the search-coil magnetometer 20 include about two-digit superimposed component as shown in FIG. 6(a). When there is an assumption that their sensitivities at the superimposed component are the same, Equation (1) may be modified into Formula (2) as indicated below:

$$V_c = V(R_c + 1/(j\omega C_c))/(R_c + 1/(j\omega C_c)) - V \qquad \text{Equation (2)}$$

In Equation (2), there is a relationship of $V=V_1=V_2$ in a wide frequency band including a crossover frequency ($1/(2\pi C_c R_c)$) in which attribution to the respective output $V_1$, and the output $V_c$ as synthesized from the output $V_1$ becomes the same.

Figure 6B:
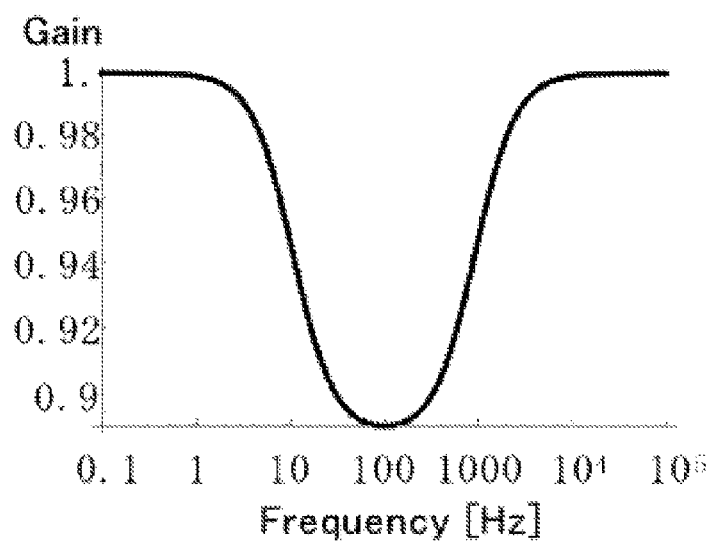
FIG. 6(b) is a frequency response characteristic diagram showing a synthesized gain in the synthesized output from the C-R voltage-dividing circuit.
Figure 6C:
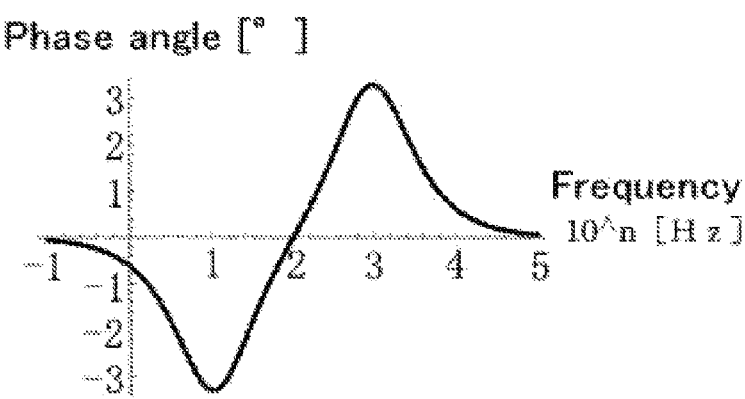
FIG. 6(c) is a frequency response characteristic diagram showing a phase lag in the synthesized output from the C-R voltage-dividing circuit.

For example, in case where there is just a two digit frequency band of the superimposed portion of the property curve having the same gain, and a gradient of a roll-off is 20 dB/dec, the synthesized output $V_c$ has a drop of gain about 10% at the crossover frequency, as shown in FIG. 6(b), and there occurs a delay or lead of phase of about 3° at the respective cutoff frequency of the orthogonal flux-gate magnetometer 10 and the search-coil magnetometer 20, as shown in FIG. 6(c). When the frequency band of the superimposed portion of the property curve having the same gain is widened, the lag or lead of phase further decreases, thus achieving the magnetic sensor 100 for the active magnetic shield with a stable operation in which the frequency response characteristic is real (i.e., the phase lag is null).

As described above, the magnetic field sensor 100 according to the embodiment of the present invention provides effects of making the sensor small by placing the orthogonal flux-gate magnetometer 10 and the search-coil magnetometer 20 closely to each other, and measuring a magnetic field from a direct-current magnetic field to an alternate-current magnetic field of a high-frequency band at the same or near point.

In addition, in the magnetic field sensor 100 according to the embodiment of the present invention, the second magnetic core 21 of the search-coil magnetometer 20 functions as a magnet collector for the orthogonal flux-gate magnetometer 10, and therefore the sensor provides an effect of measuring the magnetic field with high sensitivity.

In addition, in the magnetic field sensor 100 according to the embodiment of the present invention, the parallel portions 1a of the first magnetic core 1 are placed closely to each other to control a magnetic field interference of the orthogonal flux-gate magnetometer 10 to the search-coil magnetometer 20. Even when the orthogonal flux-gate magnetometer 10 and the search-coil magnetometer 20 are placed closely to each other, it is therefore possible to provide an effect of operating always (simultaneously) two operational modes by the orthogonal flux-gate magnetometer 10 and the search-coil magnetometer 20.

Further, in the magnetic field sensor 100 according to the embodiment of the present invention, there is applied a synthesizing process by the C-R voltage dividing circuit 31 for the resistance $R_c$ and the condenser $C_c$, resulting in providing an effect of obtaining the synthesized output of the outputs from the orthogonal flux-gate magnetometer 10 and the search-coil magnetometer 20 in the form of a seamless smooth property in frequency response characteristic.

Experimental Examples

In order to confirm effects of the present invention, the following experiments were carried out, taking particular note of frequency response characteristic.

Concerning an experiment method, a Cubic-3 coil (a 3-coil system composed of three rectangular coils with a side of 150 cm) and a circular coil having respective known coil constants were used and a magnetic field was applied to the magnetic sensor 100 according to the embodiment of the present invention, and a coil current and a magnetometer output were measured with the use of a frequency response analyzer (FRA) manufactured by NF Corporation.

What should be noted in this experiment is a self-resonance of the magnetic field generating coil, and a contiguous state to a resonance point would cause a phase lag between the coil current and the magnetic field generated by the coil. When the frequency exceeds 10 kHz, especially, inductance becomes larger relative to a meter-seized coil, and a sufficient attention to it should be paid.

Figure 7A:
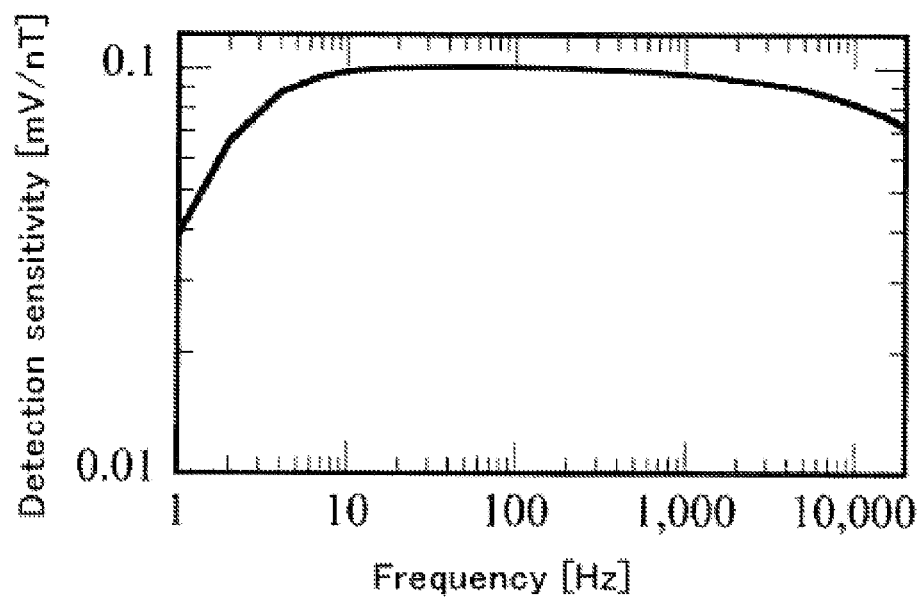
FIG. 7(a) is a frequency response characteristic diagram showing a frequency response characteristic of a gain of the search-coil magnetometer by itself.

Concerning the magnetic sensor 100, the low cutoff frequency was set as about 3 kHz as shown in FIG. 7(a) by setting the feedback resistance $R_f$ as 5 kΩ and adjusting values of the resistance $R_T$ and the condenser $C_T$, in the circuit as shown in FIG. 3(a).

It appears that the magnetic field can be measured with a certain resolution performance in a plane portion of the detection sensitivity in the characteristic curve as shown in FIG. 7(a). However, an inductive voltage (signal) from the search-coil magnetometer 20 is proportional to a frequency, and thus a signal-to-noise ratio (an SN ratio) is also proportional to a frequency. More specifically, concerning the output from the search-coil magnetometer 20, a noise becomes large in a low-frequency band.

Figure 7B:
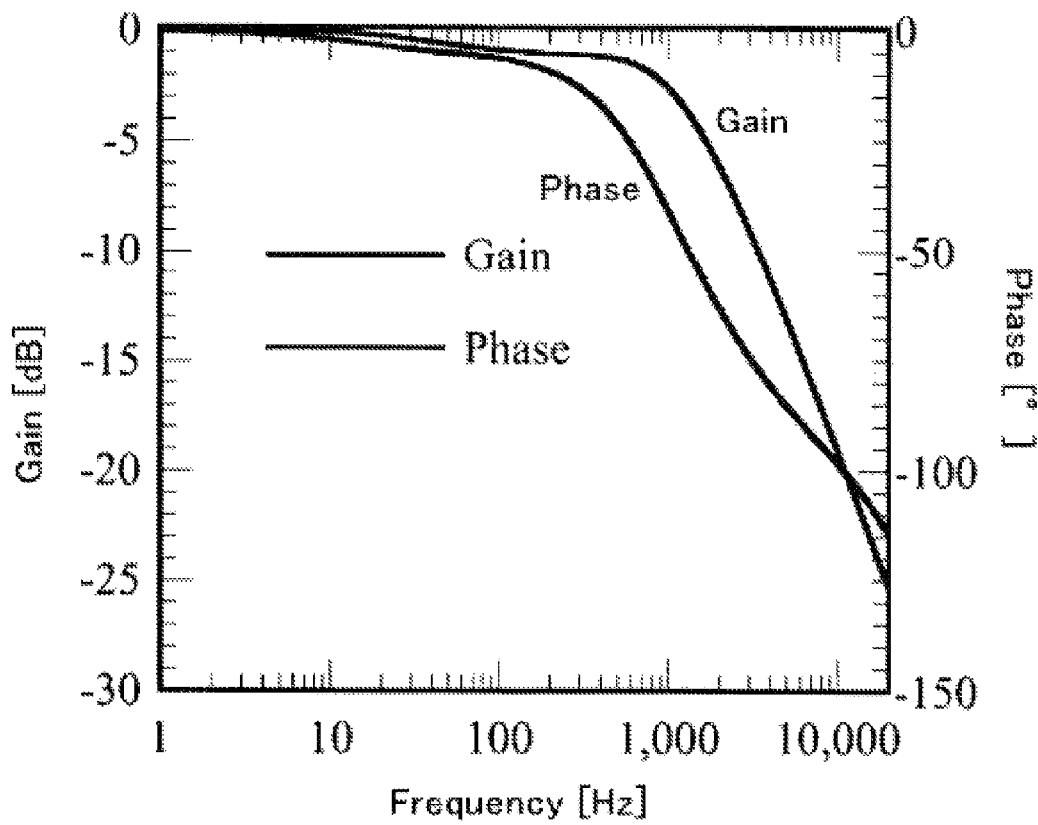
FIG. 7(b) is a frequency response characteristic diagram showing frequency response characteristic of the gain and a phase of the orthogonal flux-gate magnetometer by itself.

The cutoff frequency of the orthogonal flux-gate magnetometer 10 is set as being slightly higher than 1 kHz, as shown in FIG. 7(b). However, when it exceeds this cutoff frequency, a phase lag becomes large. It is known from the other experiment that the sensitivity of this orthogonal flux-gate magnetometer 10 is 0.23V/μT. Therefore, it is necessary to amplify the output from the search-coil magnetometer 20 with a low sensitivity, in order to perform a synthesizing process as shown in FIG. 1(a). This adjustment was made within a band from a hundred of Hz to hundreds of Hz, after combined with the combined sensor head 103 as shown in FIG. 2(a), and the crossover frequency was set as 100 Hz.

Figure 8A:
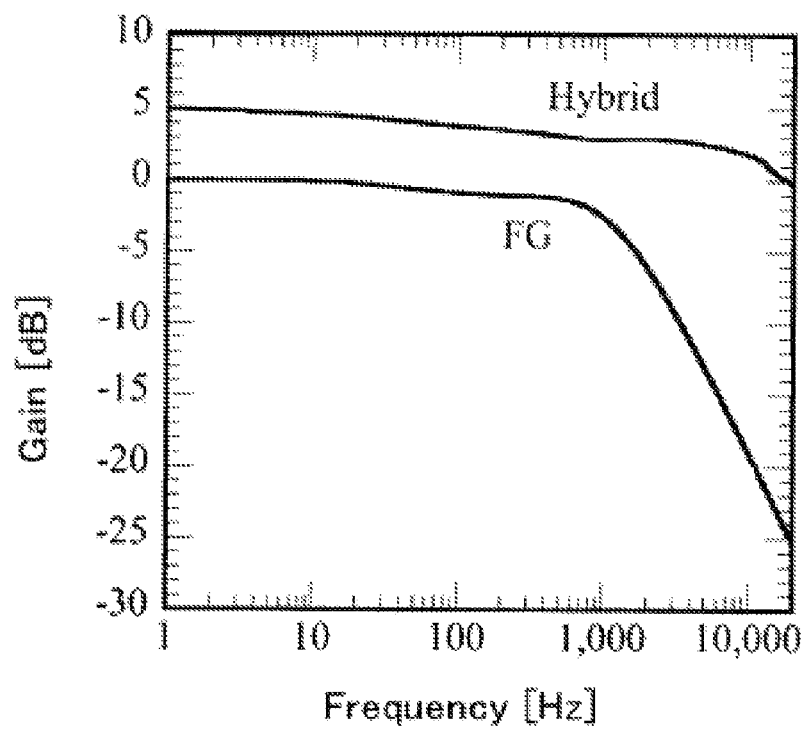
FIG. 8(a) is a frequency response characteristic diagram showing frequency response characteristic of gains of the magnetic sensor and the orthogonal flux-gate magnetometer by itself, as shown in FIG. 1(a)

It is understood that the sensitivity of the orthogonal flux-gate magnetometer 10 becomes high by combining ("Hybrid" in FIG. 8(a)) the orthogonal flux-gate magnetometer 10 and the search-coil magnetometer 20, as shown in FIG. 8(a). This is provided by a magnet collection effect by the cylinder solid of magnetic material (the second magnetic core 21 of the search-coil magnetometer 20), as shown in FIG. 5. In FIG. 8(a), a gain in a frequency band of the direct current magnetic field by the orthogonal flux-gate magnetometer 10 by itself ("FG" in FIG. 8(a). was set as 0 dB.

A gain of the magnetic sensor 100 ("Hybrid" in FIG. 8(a)) increases by about 5 db (1.78 times) relative to the gain of the orthogonal flux-gate magnetometer 10 ("FG" in FIG. 8(a)) by combining the orthogonal flux-gate magnetometer 10 and the search-coil magnetometer 20, as shown in FIG. 8(a). This result coincides with about twice as much as the maximum increasing ratio as shown in FIG. 5 (the peak of the magnetic flux density in case of an amount of insertion of 5 mm relative to the peak of the magnetic flux density in the example for comparison).

In addition, a gain of the magnetic sensor 100 is within a range of −3 dB, even when the frequency increases to 10 kHz, while a gain characteristic of the magnetic sensor 100 slightly decreases along with increase in frequency, as shown in FIG. 8(a).

Figure 8B:
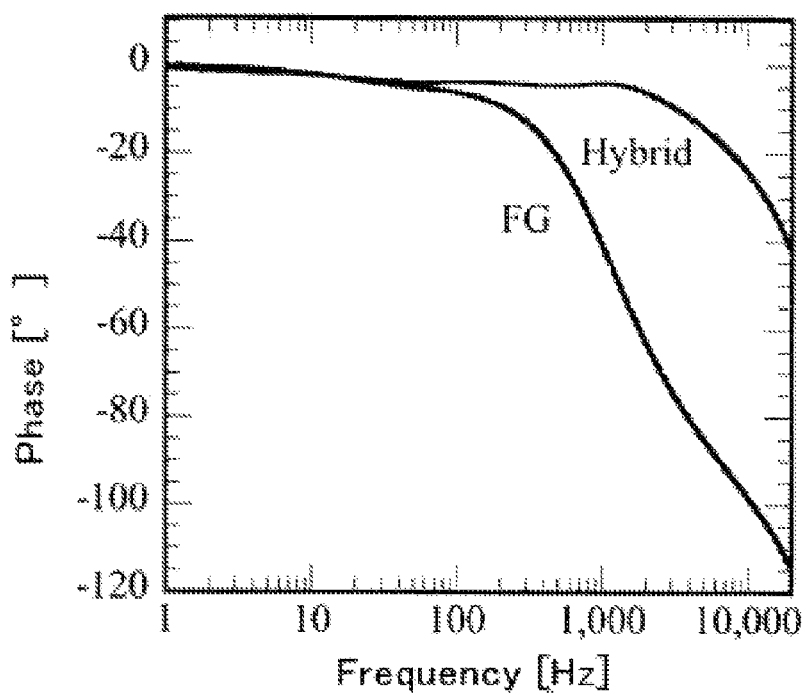
FIG. 8(b) is a frequency response characteristic diagram showing frequency response characteristic of phases of the magnetic sensor and the orthogonal flux-gate magnetometer by itself, as shown in FIG. 1(a)

Further, it is understood that a rotation in phase in the magnetic sensor 100 ("Hybrid" in FIG. 8(b)) is remarkably controlled relative to the orthogonal flux-gate magnetometer 10 ("FG" in FIG. 8(b)), by combining ("Hybrid" in FIG. 8(a)) the orthogonal flux-gate magnetometer 10 and the search-coil magnetometer 20, as shown in FIG. 8(b).

Using the magnetic sensor 100 with a small rotation in phase in this manner makes it possible to increase a loop gain when manufacturing an active magnetic shield based on a negative feedback, thus performing a high shield effect.

Description will be given below of results of a study of a noise characteristic of the magnetic sensor 100 with reference to FIG. 9.

Figure 9:
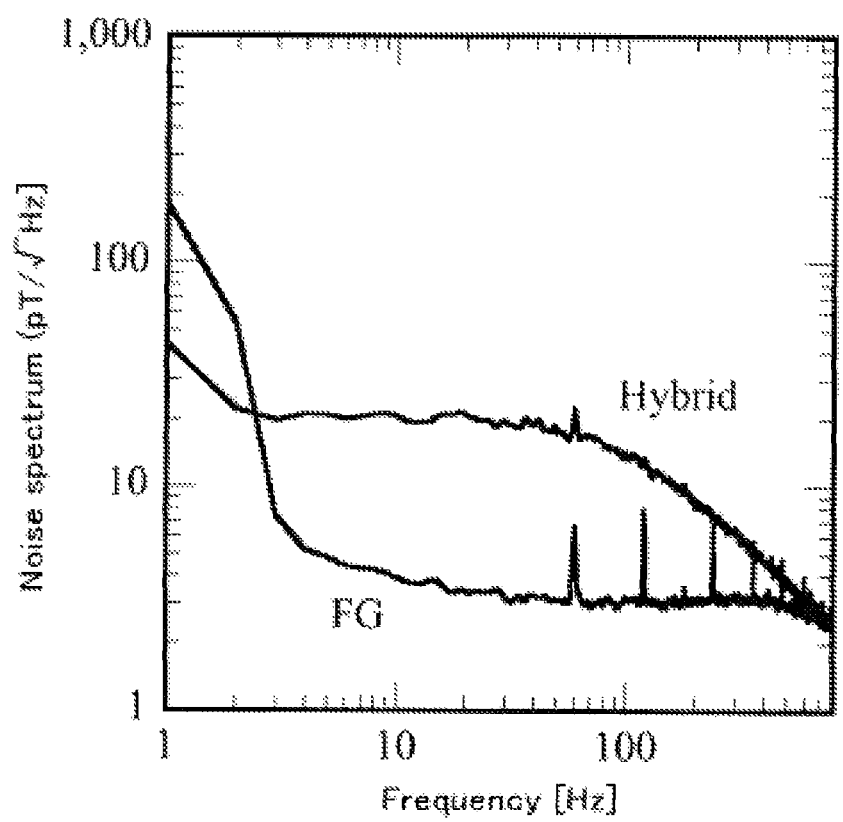
FIG. 9 is a frequency response characteristic diagram showing a frequency dependency of noise of the magnetic sensor and the orthogonal flux-gate magnetometer by itself, as shown in FIG. 1(a).

Here, a sharp increase in noise of several Hz or less are ignored, since there is a small number of sample points, thus being inappropriate for sufficient accuracy, as shown in FIG. 9.

A noise characteristic of the orthogonal flux-gate magnetometer 10 resembles $1/\sqrt{f}$ in a frequency band of from several Hz to 10 Hz, and has a flat white-noise characteristic in the frequency band, which is equal to or more than it.

On the other hand, a noise characteristic of the search-coil magnetometer 20 varies with 1/f in a frequency band, which is equal to or more than the cutoff frequency (a gradient becomes −1 in a Log-Log plot). This variation may be confirmed as shown in FIG. 9 by the frequency band, which is equal to or more than 100 Hz of "Hybrid" in FIG. 9.

When, concerning the magnetic sensor 100, a noise of the search-coil magnetometer 20 is more dominative than a noise of the orthogonal flux-gate magnetometer 10 in the frequency band of 100 Hz or less, in order to synthesize the output of the orthogonal flux-gate magnetometer 10 and the output of the search-coil magnetometer 20, a noise spectrum becomes flat.

To the contrary, in the magnetic sensor 100 according to the embodiment of the present invention, the number of turns of the second detection coil 22 of the search-coil magnetometer 20 is 300 turn and small as the search coil, as described above. Accordingly, a noise level of the search-coil magnetometer 20 becomes higher, and a noise spectrum becomes flat in a frequency band of 100 Hz or less, as shown in FIG. 9.

Therefore, it is contemplated that, when the number of turns of the second detection coil 22 of the search-coil magnetometer 20 is about 10 times (3000 turn) as much as the present number of turns, a flat portion of a characteristic curve of a noise of the magnetic sensor 100 becomes the same as a noise characteristic of the orthogonal flux-gate magnetometer 10. However, a mere increase in the number of turns of the second detection coil 22 may lead to decrease in a self-resonance frequency, thus requiring any counter-measure.

DESCRIPTION OF REFERENCE NUMERALS 1 first magnetic core
1a parallel portion
1b curved portion
1c input terminal
2 first detection coil
2a terminal
3 first sensor head
10 orthogonal flux-gate magnetometer
11 pre-amplifier
12 phase-sensitive detector
13 low-pass filter
14 operational amplifier
20 search-coil magnetometer
21 second magnetic coil
22 second detection coil
22a terminal
23 feedback coil
24 second sensor head
25 non-inverting amplifier circuit
26 integration circuit
30 synthesizing unit
31 C-R voltage dividing circuit
32 buffer circuit
40 supporting member
40a one end
40b the other end
41 large-diameter hole
42 small-diameter hole
100 magnetic field sensor
103 combined sensor head
f alternate-current excitation frequency

What is claimed is:

1. A magnetic sensor comprising:
an orthogonal flux-gate magnetometer having a first sensor head comprising a first magnetic core at least parallel portions of which are formed of magnetic material, and a first detection coil wound around said first magnetic core, said parallel portions of said first magnetic core being placed closely to each other; and
a search-coil magnetometer having a second sensor head comprising a second magnetic core having a central axis placed coaxially with a central axis of the first magnetic core of said orthogonal flux-gate magnetometer, and a second detection coil wound around said second magnetic core,
wherein:
the first sensor head of said orthogonal flux-gate magnetometer is placed in a region in which magnetic flux density is increased through a magnet collection effect by the second magnetic core of said search-coil magnetometer.

2. The magnetic sensor, as claimed in claim 1, wherein:
the second magnetic core of said search-coil magnetometer is cylindrical; and
a part of the first sensor head of said orthogonal flux-gate magnetometer is placed within the second magnetic core of said search-coil magnetometer.

3. The magnetic sensor, as claimed in claim 2, wherein:
a ratio of the part of the first sensor head of said orthogonal flux-gate magnetometer, which is placed within the second magnetic core of said search-coil magnetometer, to an entire length of the first sensor head of said orthogonal flux-gate magnetometer is 60% or less.

4. The magnetic sensor, as claimed in claim 3, wherein:
the first magnetic core of said orthogonal flux-gate magnetometer has a curved portion of magnetic material extending to said parallel portions.

5. The magnetic sensor, as claimed in claim 2, wherein:
the first magnetic core of said orthogonal flux-gate magnetometer has a curved portion of magnetic material extending to said parallel portions.

6. The magnetic sensor, as claimed in claim 1, wherein:
a ratio of a distance between an end of the first sensor head of said orthogonal flux-gate magnetometer and an end of the second magnetic core of said search-coil magnetometer relative to an entire length of the first sensor head of said orthogonal flux-gate magnetometer is 20% or less.

7. The magnetic sensor, as claimed in claim 6, wherein:
the first magnetic core of said orthogonal flux-gate magnetometer has a curved portion of magnetic material extending to said parallel portions.

8. The magnetic sensor, as claimed in claim 1, wherein:
a distance between an end of the first sensor head of said orthogonal flux-gate magnetometer and an end of the second magnetic core of said search-coil magnetometer is equal to or smaller than a diameter of the first sensor head of said orthogonal flux-gate magnetometer.

9. The magnetic sensor, as claimed in claim 8, wherein:
the first magnetic core of said orthogonal flux-gate magnetometer has a curved portion of magnetic material extending to said parallel portions.

10. The magnetic sensor, as claimed in claim 1, wherein:
the first magnetic core of said orthogonal flux-gate magnetometer has a curved portion of magnetic material extending to said parallel portions.

* * * * *